(12) United States Patent
Rodder et al.

(10) Patent No.: US 9,653,287 B2
(45) Date of Patent: May 16, 2017

(54) S/D CONNECTION TO INDIVIDUAL CHANNEL LAYERS IN A NANOSHEET FET

(71) Applicant: Samsung Electronics Co., Ltd., Suwon-si, Gyeonggi-do (KR)

(72) Inventors: Mark Rodder, Dallas, TX (US); Joon Hong, Austin, TX (US); Jorge Kittl, Round Rock, TX (US); Borna Obradovic, Leander, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/919,634

(22) Filed: Oct. 21, 2015

(65) Prior Publication Data

US 2016/0126310 A1 May 5, 2016

Related U.S. Application Data

(60) Provisional application No. 62/072,542, filed on Oct. 30, 2014.

(51) Int. Cl.
*H01L 21/02* (2006.01)
*H01L 29/417* (2006.01)
*H01L 29/786* (2006.01)
*H01L 29/45* (2006.01)
*H01L 29/66* (2006.01)
(Continued)

(52) U.S. Cl.
CPC .. *H01L 21/02603* (2013.01); *H01L 21/28518* (2013.01); *H01L 21/28531* (2013.01); *H01L 29/0665* (2013.01); *H01L 29/41733* (2013.01); *H01L 29/41758* (2013.01); *H01L 29/45* (2013.01); *H01L 29/66742* (2013.01); *H01L 29/78696* (2013.01)

(58) Field of Classification Search
CPC ............. H01L 21/02603; H01L 21/283; H01L 29/0665; H01L 29/41733; H01L 29/41758; H01L 29/45; H01L 29/4925; H01L 29/665; H01L 29/66742; H01L 29/78696
See application file for complete search history.

(56) References Cited

U.S. PATENT DOCUMENTS

| | | |
|---|---|---|
| 5,357,119 A | 10/1994 | Wang et al. |
| 8,907,427 B2 | 12/2014 | Zhang |
| 9,362,355 B1 * | 6/2016 | Cheng ................. H01L 29/0673 |

(Continued)

*Primary Examiner* — Allan R Wilson
(74) *Attorney, Agent, or Firm* — Renaissance IP Law Group LLP

(57) ABSTRACT

A field effect transistor (FET) and a method to form the FET are disclosed. The FET comprises a channel region comprising a nanosheet layer/sacrificial layer stack. The stack comprises at least one nanosheet layer/sacrificial layer pair. Each nanosheet layer/sacrificial layer pair comprises an end surface. A conductive material layer is formed on the end surface of the pairs, and a source/drain contact is formed on the conductive material layer. In one embodiment, the sacrificial layer of at least one pair further may comprise a low-k dielectric material proximate to the end surface of the pair. A surface of the low-k dielectric material proximate to the end surface of the pair is in substantial alignment with the end surface of the nanosheet layer. Alternatively, the surface of the low-k dielectric material proximate to the end surface of the pair is recessed with respect to the end surface of the nanosheet layer.

16 Claims, 15 Drawing Sheets

(51) Int. Cl.
*H01L 29/06* (2006.01)
*H01L 21/285* (2006.01)

(56) References Cited

U.S. PATENT DOCUMENTS

| | | | | |
|---|---|---|---|---|
| 2006/0125018 A1* | 6/2006 | Lee | ................ | H01L 21/823807 |
| | | | | 257/369 |
| 2013/0134444 A1 | 5/2013 | Adam et al. | | |
| 2014/0264280 A1* | 9/2014 | Kim | ..................... | H01L 29/785 |
| | | | | 257/29 |
| 2014/0329379 A1* | 11/2014 | Kim | ................ | H01L 21/28008 |
| | | | | 438/586 |
| 2015/0090958 A1* | 4/2015 | Yang | .................. | H01L 29/0676 |
| | | | | 257/27 |
| 2016/0211322 A1* | 7/2016 | Kim | ................ | H01L 29/66795 |

* cited by examiner

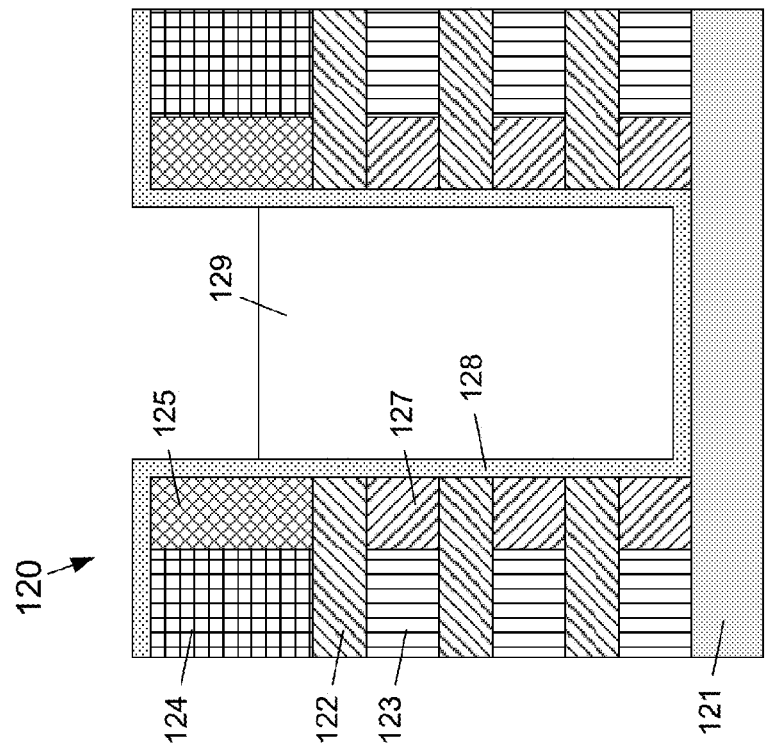
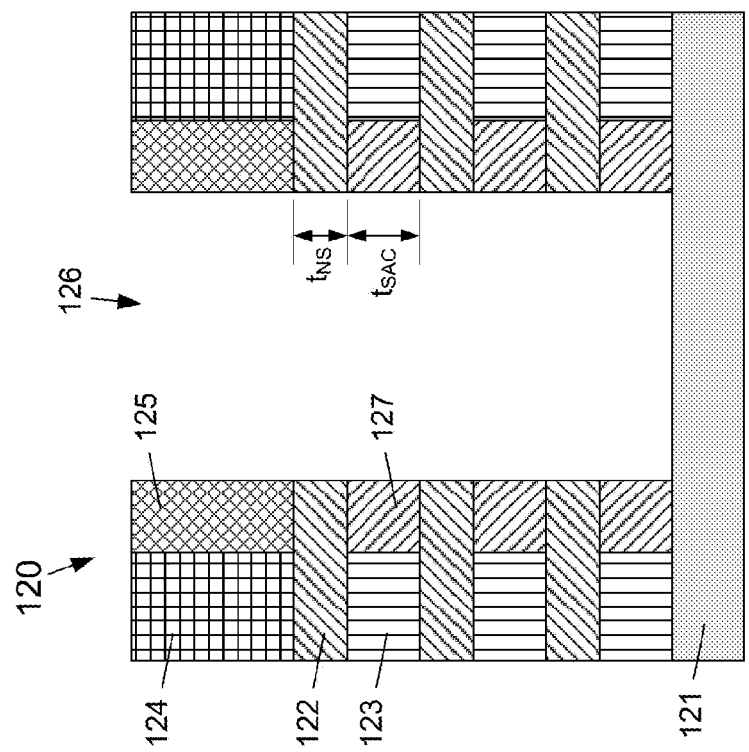
FIG. 1C
FIG. 1D

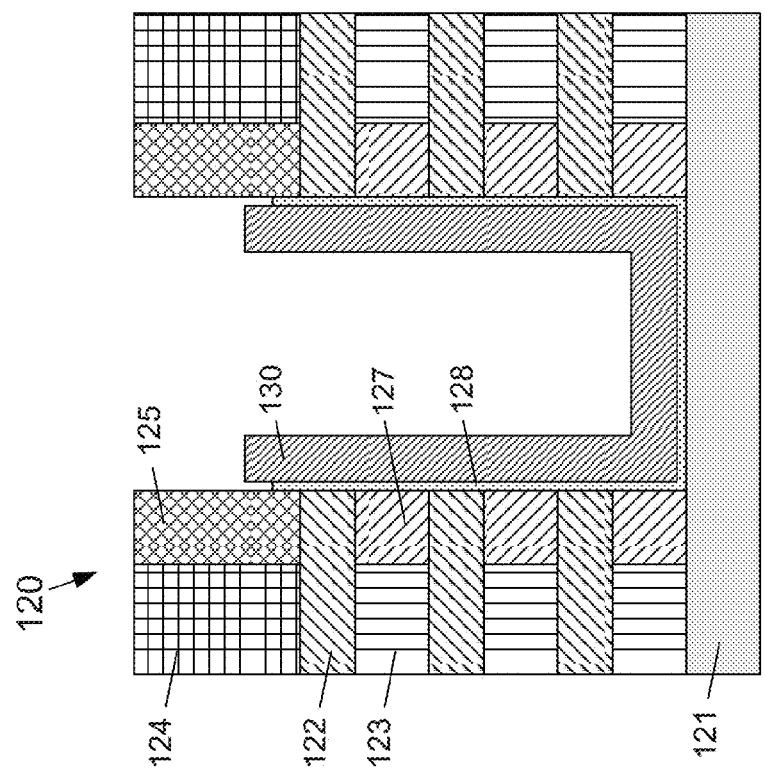
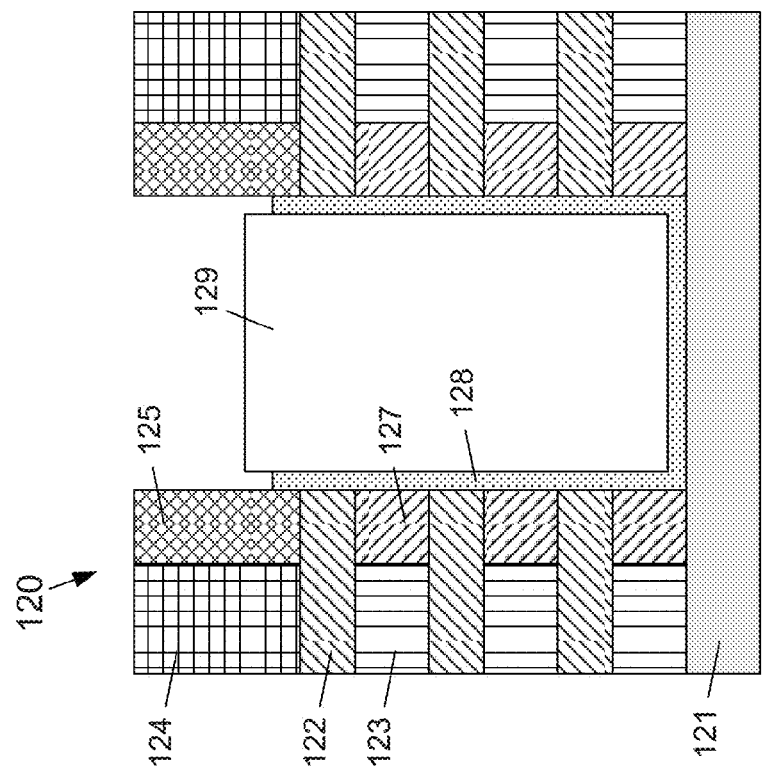
FIG. 1F
FIG. 1E

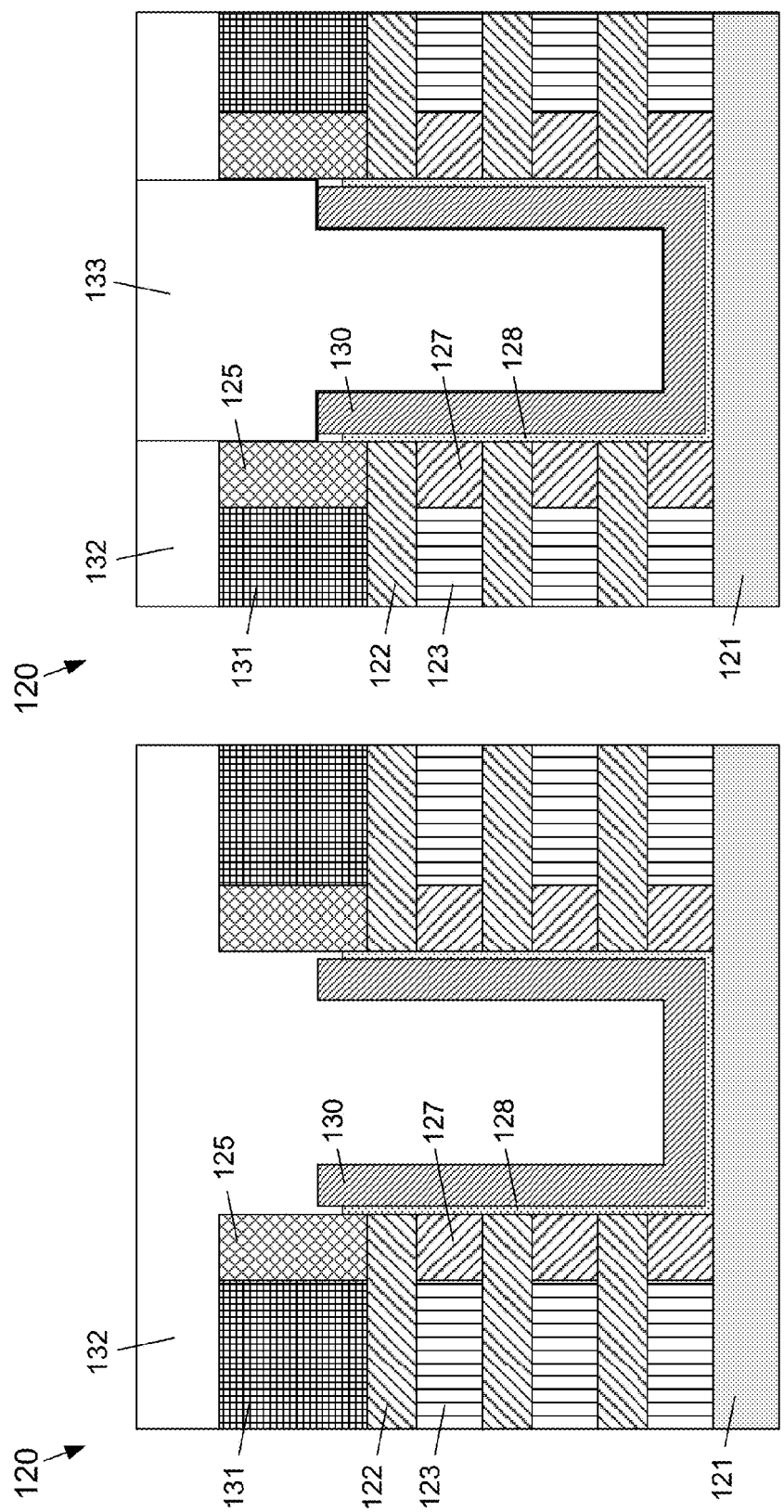

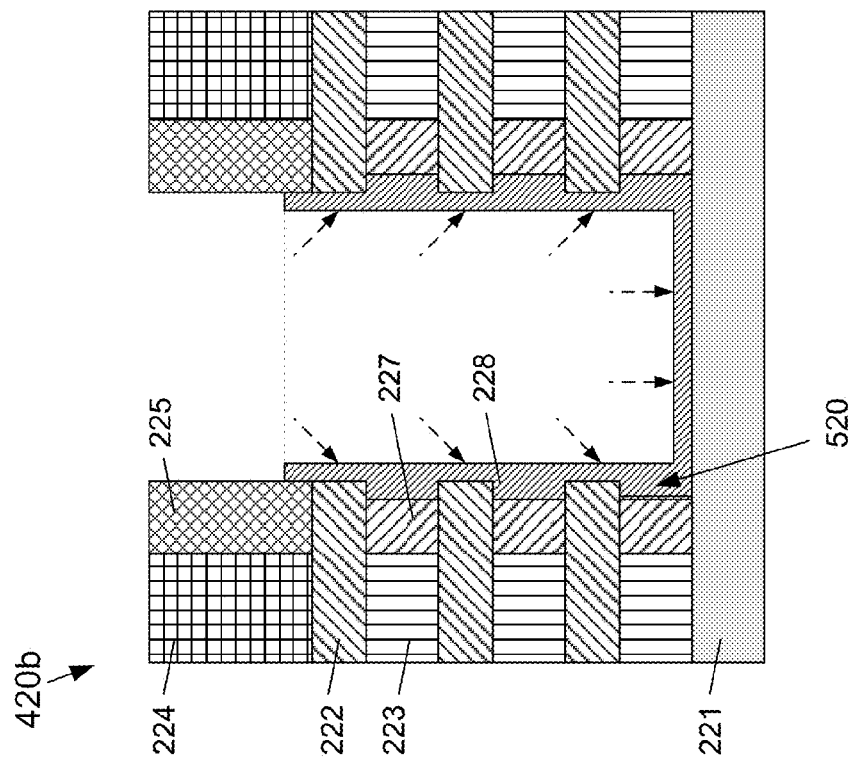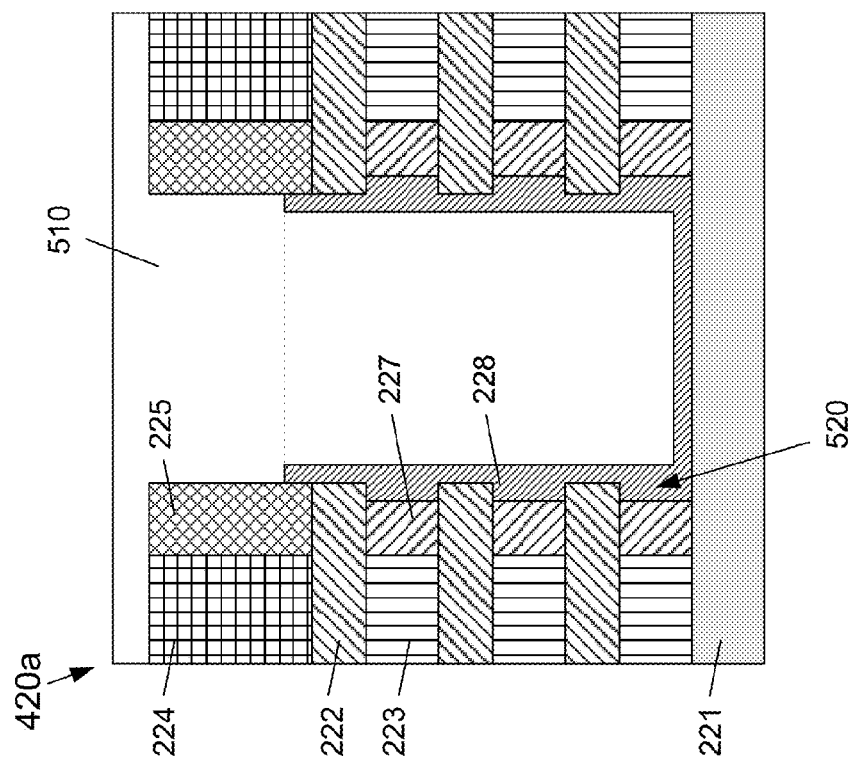

S/D CONNECTION TO INDIVIDUAL CHANNEL LAYERS IN A NANOSHEET FET

CROSS-REFERENCE TO RELATED APPLICATION

This application claims priority under 35 U.S.C. §120 to U.S. Provisional Patent Application Ser. No. 62/072,542 filed on Oct. 30, 2014, the contents of which are incorporated by reference in their entirety herein.

BACKGROUND

A conventional technique to form electrical connections between the individual channel layers of a nanosheet Field Effect Transistor (FET) and Source/Drain (S/D) contacts uses a selective epitaxial process to form epitaxial regions that are grown from the end surfaces of the channel layers (nanosheets). Such a conventional approach depends on the separation between the individual channel layers and can result in voids between the different epitaxial regions. Additionally, the conventionally formed electrical connections between the individual channels layers and the S/D contacts can result in a relatively high parasitic resistance $R_{PARA}$ and a relatively high parasitic capacitance $C_{PARA}$, which reduces the overall performance of a nanosheet FET.

SUMMARY

Exemplary embodiments provide a method to form a semiconductor device, the method comprising: forming a nanosheet layer/sacrificial layer stack comprising at least one nanosheet layer/sacrificial layer pair, each nanosheet layer/sacrificial layer pair comprising a top surface, a bottom surface, a first end surface and a second end surface, the top surface of the pair being opposite the bottom surface and the first end surface of the pair being opposite the second end surface, the nanosheet layer being on one side of the pair and the sacrificial layer being on an opposing side of the pair, the nanosheet layer comprising a first thickness at the first end surface of the pair, the sacrificial layer comprising a second thickness at the first end surface of the pair, and the first thickness and the second thickness both being measured in a direction that is between the top surface and the bottom surface of the pair; forming a first conductive material layer comprising a first surface and a second surface, the first surface of the first conductive material layer being formed on the first end surface of the each pair of the stack, and the second surface of the first conductive material layer being opposite the first surface of the first conductive material layer; and forming a source/drain contact on the second surface of the first conductive material layer.

Exemplary embodiments provide a field effect transistor (FET) comprising a channel region, a conductive material region, and source/drain contact region. The channel region comprises a nanosheet layer/sacrificial layer stack in which the nanosheet layer/sacrificial layer stack comprises at least one nanosheet layer/sacrificial layer pair. Each nanosheet layer/sacrificial layer pair comprises a top surface, a bottom surface, a first end surface and a second end surface. The top surface of the pair is opposite the bottom surface and the first end surface of the pair is opposite the second end surface. The nanosheet layer is on one side of the pair and the sacrificial layer is on an opposing side of the pair. The nanosheet layer comprises a first thickness at the first end surface of the pair, and the sacrificial layer comprises a second thickness at the first end surface of the pair. The first thickness and the second thicknesses both being measured in a direction that is between the top surface and the bottom surface of the pair. The conductive material layer comprises a first surface and a second surface in which the first surface of the conductive material layer is formed on the first end surface of each pair of the stack, and the second surface of the conductive material layer is opposite the first surface of the conductive material layer. The source/drain contact is formed on the second surface of the conductive material layer.

Exemplary embodiments provide a field effect transistor (FET), comprising a first source/drain (S/D) region, a second S/D region, and a channel region disposed between the first S/D region and the second S/D region. The channel region comprises a plurality of nanosheet layer/sacrificial layer pairs formed on each other. Each nanosheet layer/sacrificial layer pair comprises a top surface, a bottom surface, a first end surface and a second end surface in which the top surface is opposite the bottom surface and the first end surface is opposite the second end surface. The nanosheet layer is on one side of the pair and the sacrificial layer is on an opposing side of the pair. The nanosheet layer comprises a first thickness at the first end surface of the pair and a second thickness at the second end surface of the pair, and the sacrificial layer comprises a third thickness at the first end surface of the pair and a fourth thickness at the second end surface of the pair. The first, second, third and fourth thicknesses are measured in a direction that is between the top surface and the bottom surface of the pair. The channel region further comprises a first conductive material layer comprising a first surface and a second surface in which the first surface of the first conductive material layer is formed on the first end surface of each of the plurality of pairs, and the second surface of the first conductive material layer is opposite the first surface of the first conductive material layer and is coupled to the first source/drain region.

BRIEF DESCRIPTION OF THE DRAWINGS

Example embodiments will be more clearly understood from the following detailed description taken in conjunction with the accompanying drawings. The Figures represent non-limiting, example embodiments as described herein.

FIGS. 1B-1I depict various stages of an exemplary embodiment of a nanosheet FET formed by the process depicted in FIG. 1A;

FIG. 4B depicts a cross-sectional view of a FET of a first conductivity type corresponding to line A-A' in FIG. 2A after the first masking layer has been formed;

FIG. 4C depicts a cross-sectional view of a FET of a second conductivity type corresponding to line A-A' in FIG. 2A after the deposited material has been doped;

DESCRIPTION OF EMBODIMENTS

Figure 1A:
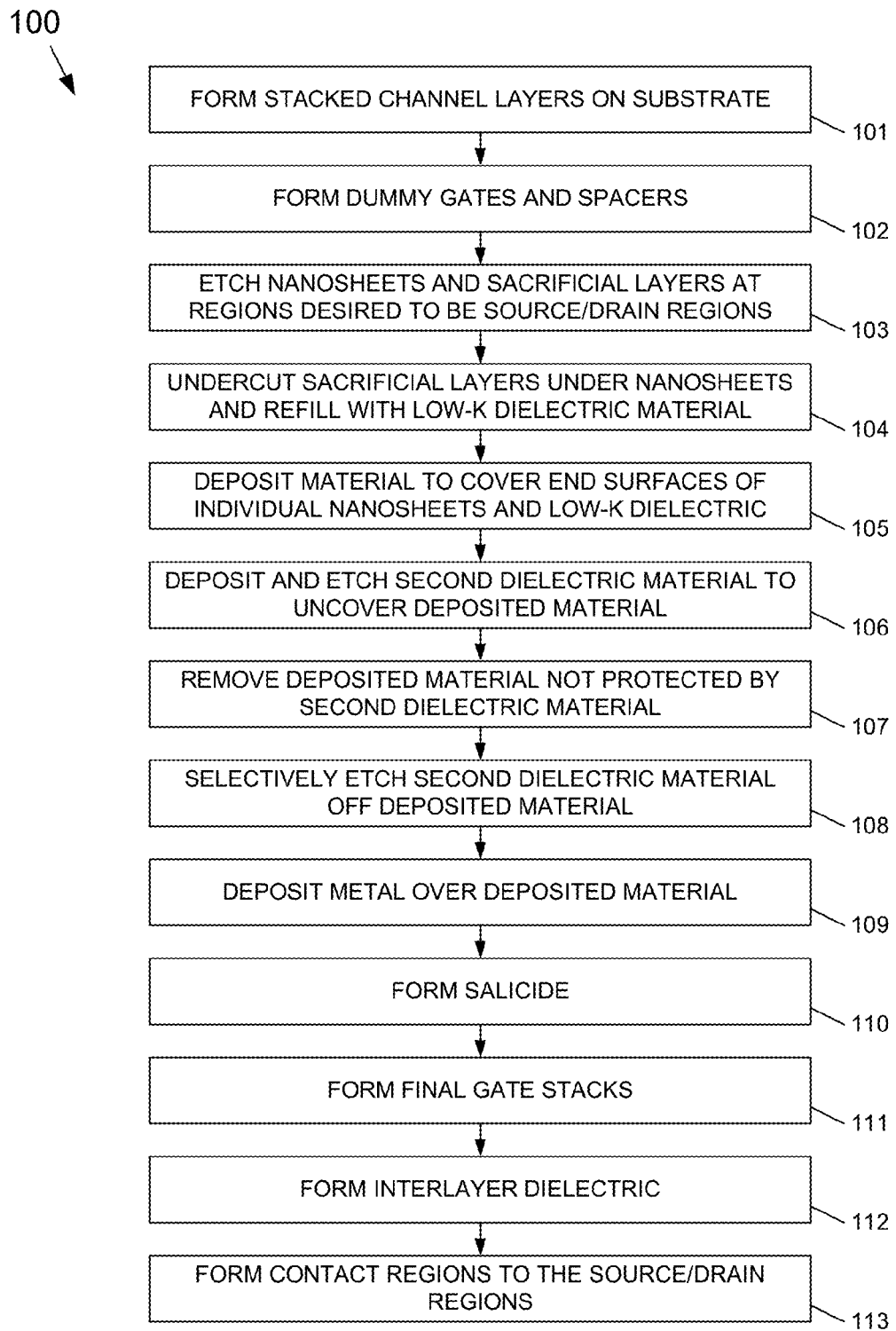
FIG. 1A depicts a flow diagram of an exemplary embodiment of a process to form electrical connections between the individual channel layers and the source/drain (S/D) connections of a nanosheet FET according to the subject matter disclosed herein.

The subject matter disclosed herein relates to multi-channel-layer (nanosheet) Field Effect Transistors (FETs). More particularly, the subject matter disclosed herein relates to nanosheet FETs and a method of forming electrical connections made between the individual multi-channel layers (nanosheets) and S/D contacts of a nanosheet FET that do not depend on the physical separation between the individual nanosheets. The electrical connections between the individual nanosheets and the S/D contacts are formed using deposition and etch processes rather than using conventional selective epitaxial deposition processes. Consequently, the electrical connections between the individual nanosheets and the S/D contacts have a lower parasitic resistance $R_{PARA}$ and a lower parasitic capacitance $C_{PARA}$ than the electrical connections formed using conventional selective epitaxial deposition techniques. Accordingly, a nanosheet FET formed by the techniques disclosed herein has overall improved performance.

Various exemplary embodiments will be described more fully hereinafter with reference to the accompanying drawings, in which some exemplary embodiments are shown. As used herein, the word "exemplary" means "serving as an example, instance, or illustration." Any embodiment described herein as "exemplary" is not to be construed as necessarily preferred or advantageous over other embodiments. The subject matter disclosed herein may, however, be embodied in many different forms and should not be construed as limited to the exemplary embodiments set forth herein. Rather, the exemplary embodiments are provided so that this description will be thorough and complete, and will fully convey the scope of the claimed subject matter to those skilled in the art. In the drawings, the sizes and relative sizes of layers and regions may be exaggerated for clarity.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claimed subject matter.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A depicts a flow diagram of an exemplary embodiment of a process 100 to form electrical connections between the individual channel layers and the S/D connections of a nanosheet FET according to the subject matter disclosed herein. FIGS. 1B-1I depict various stages of an exemplary embodiment of a nanosheet FET 120 formed by process 100.

Figure 1B:
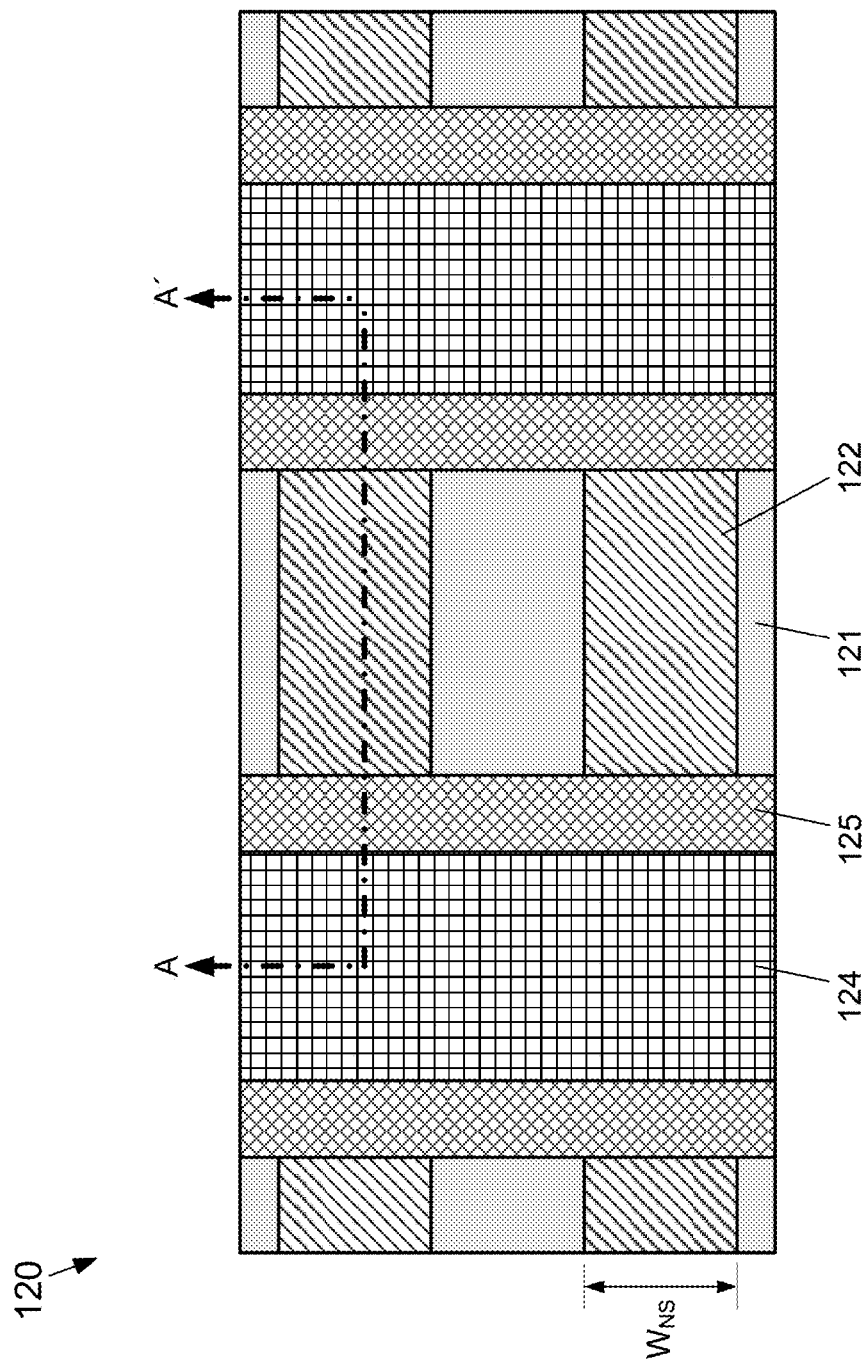

With reference to FIGS. 1A-1C, at operation 101 in process 100, one or more channel layers (nanosheets) 122 of a semiconductor material, such as silicon, silicon-germanium, indium-gallium-arsenide, or the like, are formed on a substrate 121 using well-known techniques. In one exemplary embodiment, substrate 121 may be formed from a bulk semiconductor material. In another exemplary embodiment, substrate 121 may be formed from an insulator material. Each nanosheet 122 comprises a thickness $t_{NS}$ and a width $W_{NS}$, and is separated from another nanosheet by a sacrificial layer 123 comprising a thickness of $t_{SAC}$. In an exemplary embodiment, the thickness $t_{NS}$ of a nanosheet 122 ranges from about 3 nm to about 10 nm. In an exemplary embodiment, the width $W_{NS}$ of a nanosheet 122 ranges from about 5 nm to about 50 nm. In an embodiment, the sacrificial layer 123 comprises silicon (if the nanosheet 122 is formed from silicon-germanium), silicon-germanium (if the nanosheet 122 is formed from silicon) or indium phosphide (InP) (if the nanosheet 122 is formed from indium-gallium-arsenide). In an embodiment, the thickness $t_{SAC}$ for a sacrificial layer 123 ranges from about 5 nm to about 20 nm At operation 102 in process 100, dummy gates 124 and spacers 125 are formed using a well-known technique. FIG. 1B depicts a top view of a nanosheet FET 120 after operation 102.

At operation 103, the nanosheets 122 and the sacrificial layers 123 are etched using a well-known technique at locations that are intended to be Source (S) and/or Drain (D) regions 126.

At operation 104, the sacrificial layers 123 in the regions under the nanosheets 122 are undercut, or etched back, using a well-known technique, and the undercut regions are refilled by a low-k dielectric material 127 using a well-known technique. In an embodiment, the low-k dielectric material 127 comprises SiOCH, SiOCN or SiBCN. In one exemplary embodiment, the end surfaces of the nanosheets 122 and the end surfaces of the low-k dielectric materials 127 are in substantial alignment. In one exemplary embodiment, the low-k dielectric material 127 is refilled in the etched back regions so that the end surfaces of the low-k dielectric material is within about 0 nm to about 10 nm of the end surfaces of the nanosheets 122. In another exemplary embodiment, the low-k dielectric material 127 is refilled in the etched back regions so that the end surfaces of the low-k dielectric material is within about 0 nm to about 5 nm of the end surfaces of the nanosheets 122. FIG. 1C depicts a cross-sectional view of the nanosheet FET 120 after operation 104 as viewed along line A-A' in FIG. 1B.

At operation 105, a material 128 is deposited in a well-known manner to cover the ends surfaces of the individual nanosheets 122 and the low-k dielectric material regions 127. In one exemplary embodiment, the material 128 may comprise a polycrystalline or an amorphous conductive material, a semiconductor material, a metallic material, or a combination thereof. In another exemplary embodiment, material 128 may comprise in part or in whole of Si, SiGe, Ge, III-V, oxide, silicate glass, or the like. In yet another exemplary embodiment, material 128 may comprise in part or in whole of Ti, Co, Ni, Pt, Ta, Mo, W, metallic nitrided alloys, such as TiN, TaN, or the like, and metallic nitrided silicides such as Ti—Si—N or Ta—Si—N, or the like, which may be deposited by non-selective deposition, chemical-vapor deposition, Atomic Layer Deposition (ALD), Low-pressure Chemical Vapor Deposition (LPCVD), or the like.

In one exemplary embodiment, material 128 is deposited to have a thickness of about 2 nm to about 15 nm. In another exemplary embodiment, material 128 is deposited to have a thickness of about 3 nm to about 10 nm. In still another exemplary embodiment, material 128 is deposited to have a thickness of about 2 nm to about 10 nm. In some exemplary embodiments material 128 may be deposited on other portions of the FET structure 120 that are not shown.

In one exemplary embodiment, after material 128 has been deposited, material 128 may be in-situ doped to provide desired conductivity characteristics, followed by a well-known annealing operation.

The electrical connections made between the individual nanosheets 122 and the S/D contacts that will be formed later in process 100 do not depend on the vertical separation between the individual nanosheets 122, in contrast to a conventional selective epitaxy process that may result in voids in the epitaxial growth, which depends on the vertical separation distance between the individual nanosheets. Additionally, the manner in which electrical connections are made between the individual nanosheets 122 and the S/D contacts by process 100 results in a low parasitic resistance $R_{PARA}$ and the presence of the low-k dielectric material that is formed at the end surfaces of the nanosheets 122 results in a low parasitic capacitance $C_{PARA}$.

At operation 106, a second dielectric material 129 is deposited using a well-known technique. The second dielectric material 129 is then etched back using a well-known technique to uncover a selected portion of the deposited material 128. In an embodiment, the second dielectric material 129 comprises an oxide. FIG. 1D depicts a cross-sectional view of the nanosheet FET 120 as viewed along line A-A' after operation 106.

At operation 107, the deposited material 128 is removed by an etching process, such as an isotropic etch, in regions that are not protected by the remaining second dielectric material 129. FIG. 1E depicts a cross-sectional view of the nanosheet FET 120 as viewed along line A-A' after operation 107.

At operation 108, the remaining second dielectric material 129 is selectively etched off of the deposited material 128 using a well-known etching process.

At operation 109, a metallic material is deposited over the deposited material 128 using a well-known technique. In one exemplary embodiment, the metallic material may comprise in part or in whole a metal, a reacted metallic-semiconductor compound or self-aligned reacted metal-semiconductor alloy process, such as a salicide if the semiconductor is Si. In one exemplary embodiment, a reacted metallic metal-semiconductor compound may comprise in part any of Ti, Ni, N, Co, Pt, Ta, Mo, W, or the like.

At operation 110, a salicide 130 is formed from a reaction of the metallic material deposited at operation 109 and the deposited material 128. FIG. 1F depicts a cross-sectional view of the nanosheet FET 120 as viewed along line A-A' after operation 110. Although the deposited material 128 is depicted in FIG. 1F as remaining after operation 110, it should be understood that there may be no deposited material 128 remaining after operation 110, in which case the salicide directly interfaces to the surfaces of the individual nanosheets 122. The large surface areas of salicide structure that has been formed in relation to the individual nanosheets results in providing a low parasitic resistance $R_{PARA}$ for the electrical connection between the individual nanosheets and the S/D connections that will be formed later in process 100. Additionally, the low-k dielectric material 127 provides a low parasitic capacitance $C_{PARA}$.

Figure 1G:
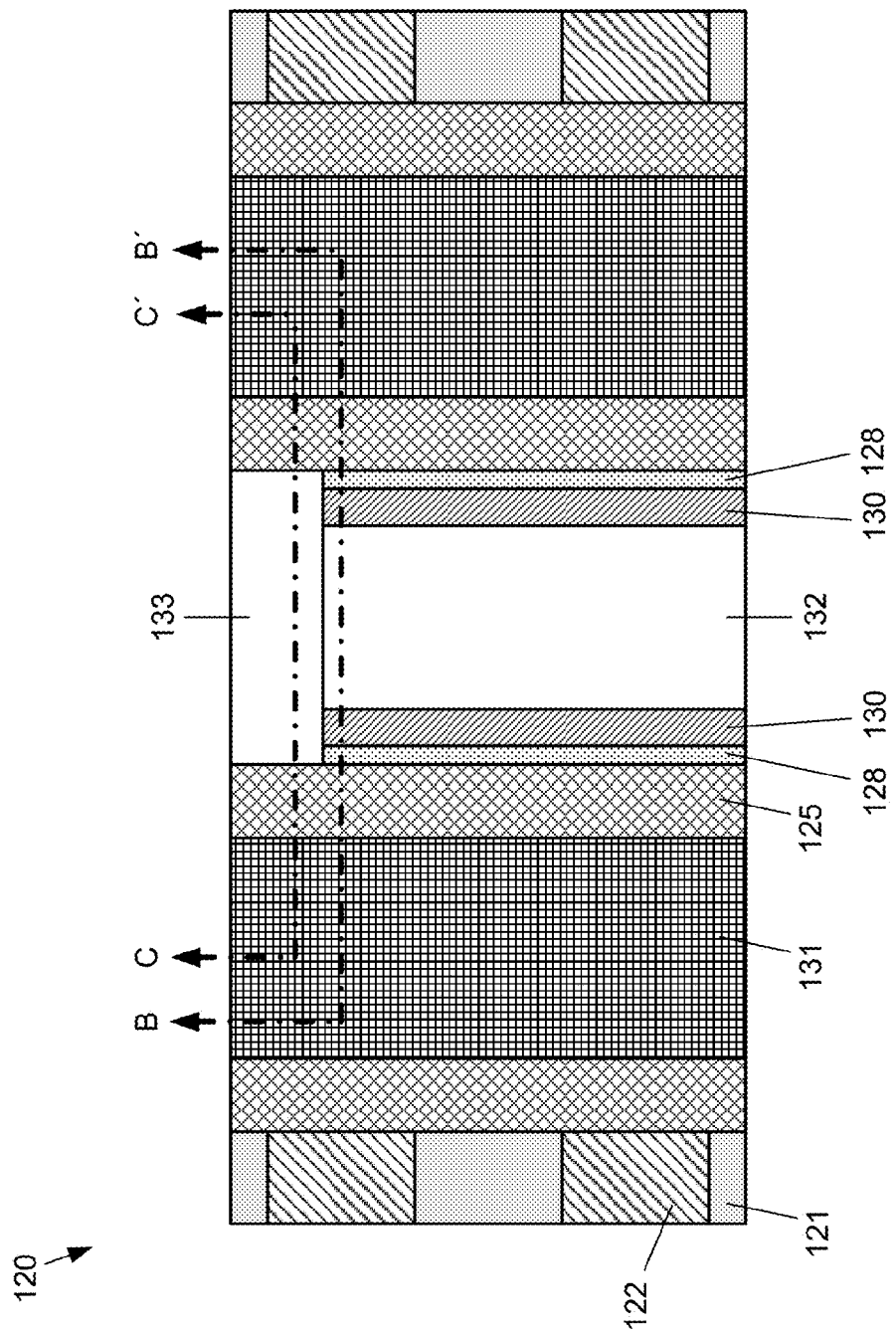

At operation 111, a final gate stack 131 is formed using well-known techniques. At operation 112, an interlayer dielectric 132 is formed using a well-known technique. At operation 113, contact regions 133 for the S/D regions are formed using a well-known technique, thereby completing the electrical connection between the individual nanosheets 122. In an embodiment, the contact regions 133 comprise cobalt or tungsten. FIG. 1G depicts a top view of the nanosheet FET 120 after operation 113. FIG. 1H depicts a cross-sectional view of the nanosheet FET 120 as viewed along line B-B' in FIG. 1G FIG. 1I depicts a cross-sectional view of the nanosheet FET 120 as viewed along line C-C' in FIG. 1G.

A first alternative exemplary embodiment of a process to form electrical connections between the individual channel layers and the S/D connections of a nanosheet FET provides that the low-k dielectric material that is refilled in the undercut regions of the sacrificial layers is removed inwardly with respect to the end surfaces of the low-k dielectric material. Thus, the electrical connection to each nanosheet that is formed wraps around the end of the nanosheet to include a portion of a top surface and a bottom surface of the nanosheet to further reduce the parasitic resistance $R_{PARA}$.

Figure 2A:
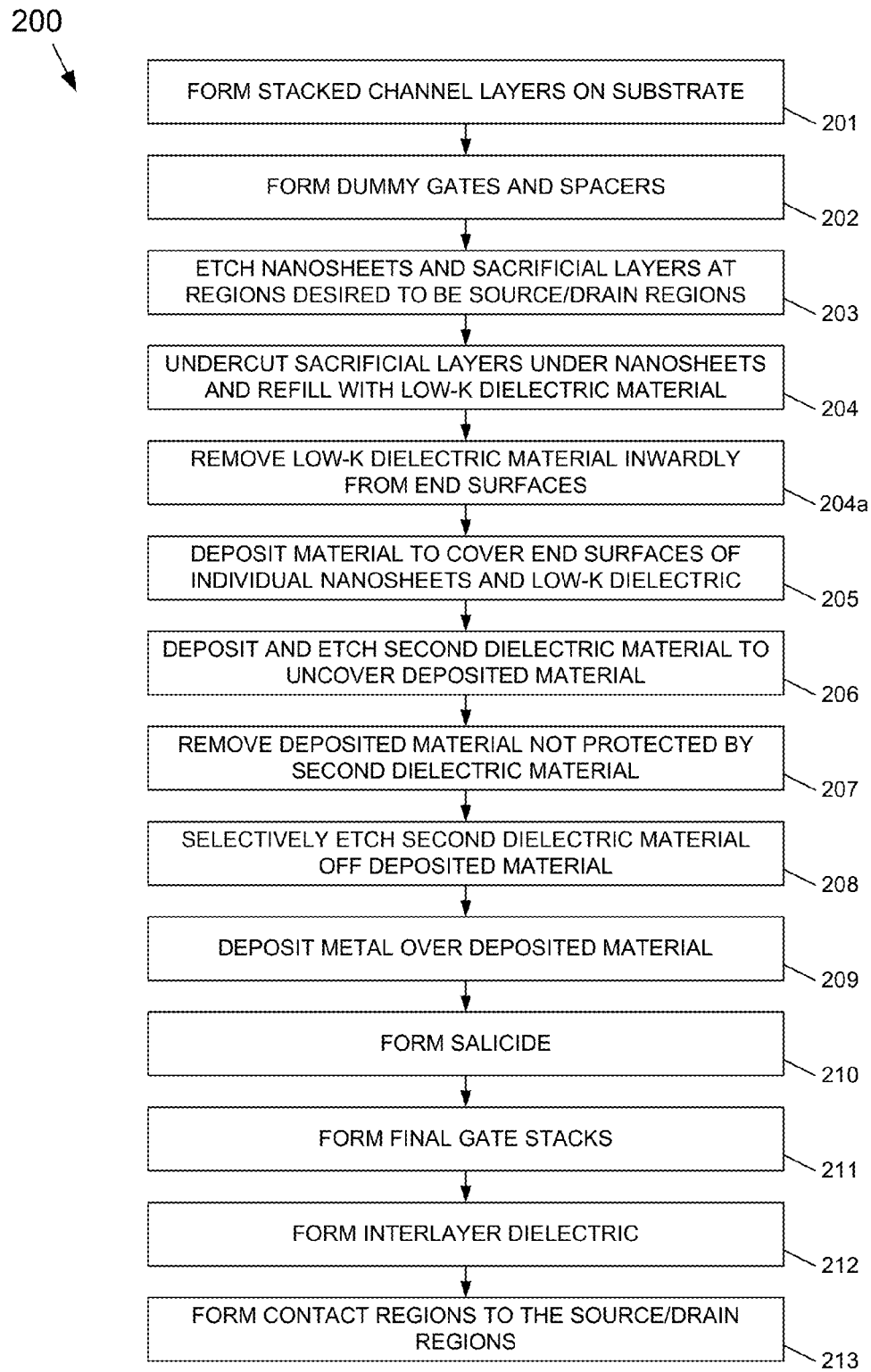
FIG. 2A depicts a flow diagram of a first alternative exemplary embodiment of a process to form electrical connections between the individual channel layers and the S/D connections of a nanosheet FET according to the subject matter disclosed herein.

FIG. 2A depicts a flow diagram of a first alternative exemplary embodiment of a process 200 to form electrical connections between the individual channel layers and the S/D connections of a nanosheet FET according to the subject matter disclosed herein.

Operations 201 through 204 of process 200 are similar to operations 101 through 104 of process 100 (FIG. 1A). That is, at operation 201, one or more channel layers (nanosheets) 222 of a semiconductor material are formed on a substrate 221 in FIG. 2A using well-known techniques. At operation 202, dummy gates 224 and spacers 225 are formed in a well-known manner. At operation 203, the nanosheets 222 and the sacrificial layers 223 are etched using a well-known technique at locations that will become Source (S) and/or Drain (D) regions 226. At operation 204, the sacrificial layers 223 in the regions under the nanosheets 222 are undercut using a well-known technique, and the undercut regions are refilled by a low-k dielectric material 227.

At operation 204a, the low-k dielectric material 227 is removed inwardly with respect to the end surfaces of the low-k dielectric material 227 in regions 240 (FIG. 2B) below each nanosheet 222 using, for example, a well-known wet etch or dry etch technique. In one exemplary embodiment, the low-k dielectric material is removed inwardly by about to a depth of between about 0-5 nm to about 0-10 nm.

At operation 205, a material 228 is deposited in a well-known manner to cover the ends surfaces of the individual nanosheets 222 and etched-back end surfaces of the low-k dielectric material regions 227. The etched-back surfaces of the low-k dielectric material 227 results in deposited material 228 wrapping around the ends of each nanosheet so that the deposited material contacts a portion of a top surface and a bottom surface of each nanosheet, thereby further reducing the parasitic resistance $R_{PARA}$.

In one exemplary embodiment, the material 228 may comprise a polycrystalline or an amorphous conductive material, a semiconductor material, a metallic material, or a combination thereof. In another exemplary embodiment, material 228 may comprise in part or in whole of Si, SiGe, Ge, III-V, or the like. In one exemplary embodiment, after material 228 has been deposited, material 228 may be in-situ doped to provide desired conductivity characteristics, followed by a well-known annealing operation.

Operations 206-213 of process 200 are similar to operations 106 through 113 of process 100 (FIG. 1A). In particular, at operation 206, a second dielectric material 229 is deposited using a well-known technique. The second dielectric material 229 is etched back using a well-known technique to uncover a portion of the deposited material 228. At operation 207, the deposited material 228 is removed by an etching process, such as an isotropic etch, in regions that are not protected by the remaining second dielectric material 229. At operation 208, the remaining second dielectric material 229 is selectively etched off of the deposited material 228. At operation 209, a metallic material is deposited over the deposited material 228 using a well-known technique. At operation 210, a salicide 230 is formed from a reaction of the metal and the deposited material 228.

Figure 2B:
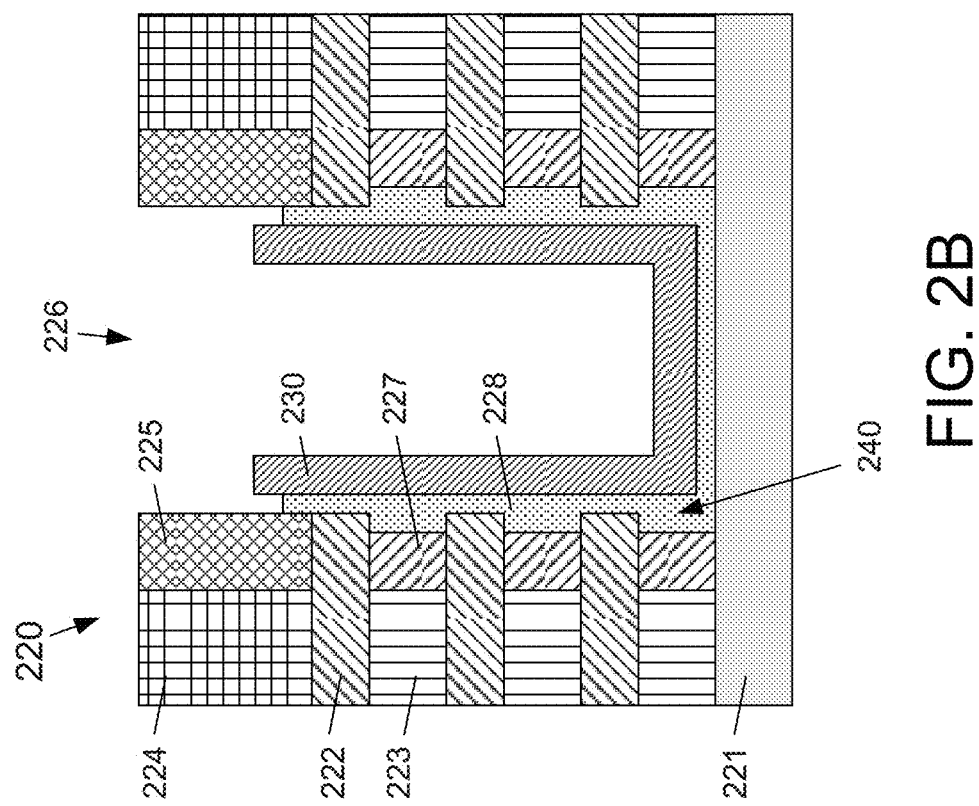
FIG. 2B depicts a cross-sectional view of the first alternative exemplary embodiment of a nanosheet FET corresponding to line A-A' in FIG. 1B after operation 210 of the process depicted in FIG. 2A.

FIG. 2B depicts a cross-sectional view of the first alternative exemplary embodiment of a nanosheet FET 220 corresponding to line A-A' in FIG. 1B after operation 210 of process 200. The inwardly etched regions 240 of the low-k dielectric material 227 provide electrical contacts to each nanosheet 222 that wrap around the end surface of each nanosheet and that includes a portion of a top surface and a bottom surface of the nanosheet 222. Such a connection configuration provides a low parasitic resistance $R_{PARA}$. Additionally, although the deposited material 228 is depicted in FIG. 2B as remaining after operation 210, it should be understood that there may be no deposited material 228 remaining after operation 210 in which case the salicide directly interfaces to the surfaces of the individual nanosheets 222.

At operation 211, a final gate stack is formed using well-known techniques. At operation 212, an interlayer dielectric is formed using a well-known technique. At operation 213, contact regions to the S/D regions are formed using a well-known technique. It should be noted that FIG. 1G could depict a top view of the nanosheet FET 220 after operation 213.

A second alternative exemplary embodiment of a process to form electrical connections between the individual channel layers and the S/D connections of a nanosheet FET provides that the low-k dielectric material that is refilled in the undercut regions of the sacrificial layers is removed inwardly with respect to the end surfaces of the low-k dielectric material. The electrical connection to each nanosheet that is formed wraps around the end of the nanosheet to include a portion of a top surface and a bottom surface of the nanosheet to further reduce the parasitic resistance $R_{PARA}$. Additionally, the second alternative exemplary embodiment provides that a metallic material is deposited on the end surfaces of the nanosheets and the low-k dielectric material, and a salicide is not formed on the deposited metallic material.

Figure 3A:
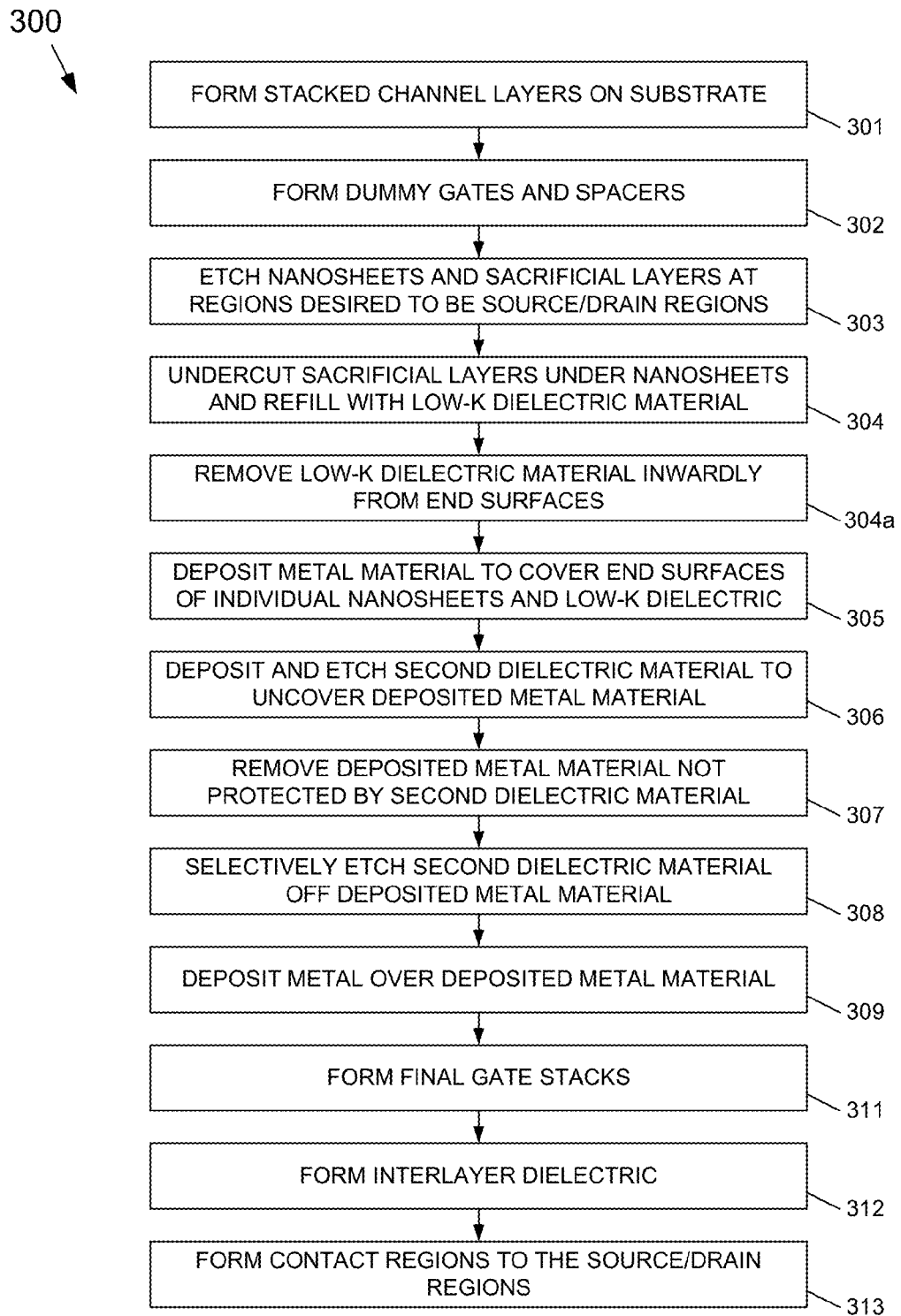
FIG. 3A depicts a flow diagram of a second alternative exemplary embodiment of a process to form electrical connections between the individual channel layers and the S/D connections of a nanosheet FET according to the subject matter disclosed herein.

FIG. 3A depicts a flow diagram of a second alternative exemplary embodiment of a process 300 to form electrical connections between the individual channel layers and the source/drain (S/D) connections of a nanosheet FET according to the subject matter disclosed herein.

Operations 301 through 304a of process 300 are similar to operations 201 through 204a of process 200 (FIG. 2A).

At operation 305, a metal material 228 is deposited in a well-known manner to cover the ends surfaces of the individual nanosheets 222 and etched-back end surfaces of the low-k dielectric material regions 227. The etched-back surfaces of the low-k dielectric material 227 again results in deposited material 228 wrapping around the ends of each nanosheet so that the deposited material contacts a portion of a top surface and a bottom surface of each nanosheet, thereby further reducing the parasitic resistance $R_{PARA}$. In one exemplary embodiment, material 228 may comprise in part or in whole of Ti, Co, Ni, Pt, Ta, Mo, W, metallic nitrided alloys, such as TiN, TaN, or the like, and metallic nitrided silicides such as Ti—Si—N or Ta—Si—N, or the like.

Figure 3B:
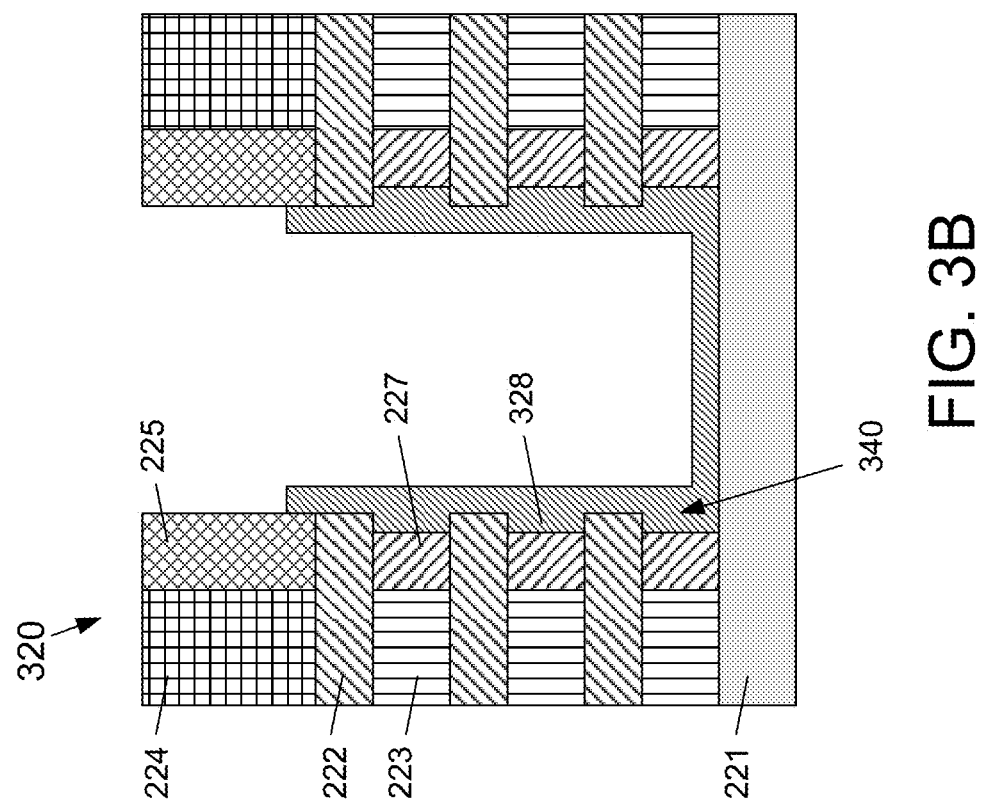
FIG. 3B depicts a cross-sectional view of the second alternative exemplary embodiment of a nanosheet FET corresponding to line A-A' in FIG. 1B after operation 308 of the process depicted in FIG. 3A.

Operations 306 through 308 of process 300 are similar to operations 206 through 208 of process 200 (FIG. 2A). FIG. 3B depicts a cross-sectional view of the second alternative exemplary embodiment of a nanosheet FET 320 corresponding to line A-A' in FIG. 1B after operation 308 of process 300. The inwardly etched regions 340 of the low-k dielectric material 227 provide electrical contacts to each nanosheet 222 that wrap around the end surface of each nanosheet and that includes a portion of a top surface and a bottom surface of the nanosheet 222.

At operation 309, a metal or metallic layer is deposited on the metal material 328 deposited in operation 305. In one exemplary embodiment, material 328 is deposited to have a thickness of about 2 nm to about 15 nm. In another exemplary embodiment, material 328 is deposited to have a thickness of about 3 nm to about 10 nm. In one exemplary embodiment, the metal or metallic layer may comprise a metal or reacted metallic-semiconductor compound or self-aligned reacted metal-semiconductor alloy process (such as a salicide if the semiconductor is Si), the reacted metallic metal-semiconductor compound comprised of in part of any of Ti, Ni, N, Co, Pt, Ta, Mo, W, or the like. For this alternative exemplary embodiment, a salicide is not formed (i.e., an operation corresponding to operation 110 in process 100 is not performed), and the process continues to operations 311 through 312, which are similar to operations 211 through 313 of process 200 (FIG. 2A).

A third alternative exemplary embodiment of a process to form electrical connections between the individual channel layers and the S/D connections of a nanosheet FET provides that the low-k dielectric material that is refilled in the undercut regions of the sacrificial layers is removed inwardly with respect to the end surfaces of the low-k dielectric material. The electrical connection to each nanosheet that is formed wraps around the end of the nanosheet to include a portion of a top surface and a bottom surface of the nanosheet to further reduce the parasitic resistance $R_{PARA}$. Additionally, the third alternative exemplary embodiment provides a process for forming S/D connections to individual channel layers of nanosheet FETs of first and second conductivity types. Thus, the third alternative exemplary embodiment is suitable for forming nanosheet FETs in Complementary Metal-Oxide-Semiconductor (CMOS) circuits.

Figure 4A:
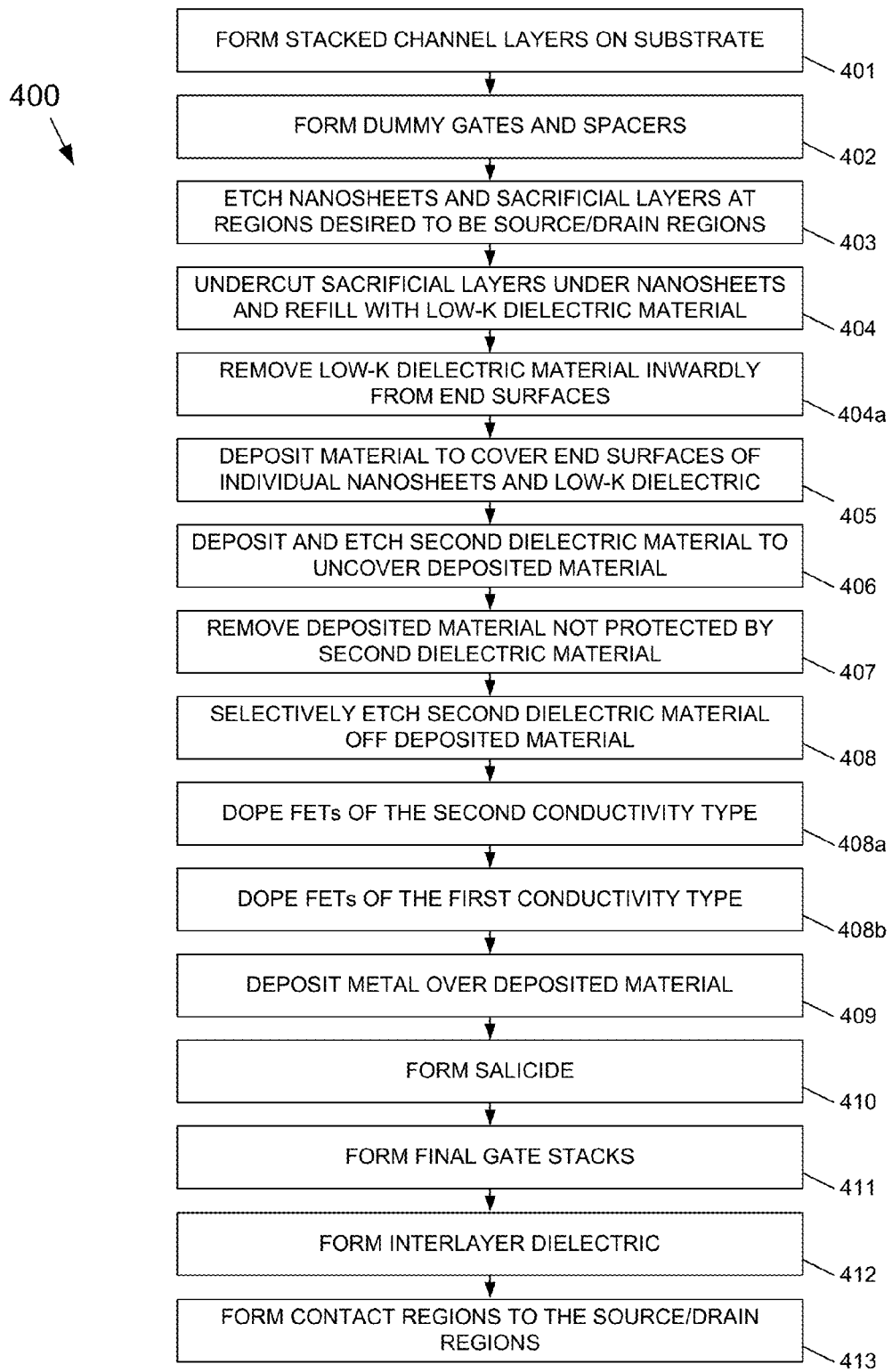
FIG. 4A depicts a flow diagram of a third alternative exemplary embodiment of a process to form electrical connections between the individual channel layers and the S/D connections of a nanosheet FET according to the subject matter disclosed herein.

FIG. 4A depicts a flow diagram of a third alternative exemplary embodiment of a process 400 to form electrical connections between the individual channel layers and the source/drain (S/D) connections of a nanosheet FET according to the subject matter disclosed herein.

Operations 401 through 404a of process 400 are similar to operations 201 through 204a of process 200 (FIG. 2A).

At operation 405, a material 228 is deposited in a well-known manner to cover the ends surfaces of the individual nanosheets 222 and etched-back the low-k dielectric material regions 227. In one exemplary embodiment, the material 128 may comprise a polycrystalline or an amorphous conductive material, a semiconductor material, or a combination thereof. In another exemplary embodiment, material 128 may comprise in part or in whole of Si, SiGe, Ge, III-V, or the like. In contrast to operation 105 of process 100, in one exemplary embodiment, after material 228 has been deposited at 405, material 228 is not in-situ doped. That is, the deposited material 228 is left undoped.

Operations 406 through 408 are similar to operations 206 through 208 of process 200 (FIG. 2A).

At operation 408a, a first masking layer 450 is form over FETs 420a of a first conductivity type. As used herein, the first conductivity type may be either an N-type FET or a P-type FET. FIG. 4B depicts a cross-sectional view of a FET 420a of the first conductivity type corresponding to line A-A' in FIG. 2A after the first masking layer 510 has been formed. The deposited material 228 formed in FETs 420b of the second conductivity type may be doped using a well-known technique, such as plasma doping, ion implantation, gas-phase doping, or the like, as indicated by the dashed arrows in FIG. 4C. FIG. 4C depicts a cross-sectional view of a FET 420b of the second conductivity type corresponding to line A-A' in FIG. 2A after the deposited material 228 has been doped. As used herein, the second conductivity type is opposite the first conductivity type. The inwardly etched regions 440 of the low-k dielectric material 227 provide electrical contacts to each nanosheet 222 that wrap around the end surface of each nanosheet and that includes a portion of a top surface and a bottom surface of the nanosheet 222.

At operation 408b, the first masking layer 510 is removed using well-known techniques, and a second masking layer (not shown) is formed on FETs 420a of the second conductivity type. The deposited material 228 formed in FETs 420a of the first conductivity type is doped using a well-known technique, such as plasma doping, ion implantation, gas-phase doping, or the like. The second masking layer is then removed using a well-known technique. It should be understood that the order of operations 408a and 408b could be reversed.

Operations 409 through 413 are similar to operations 109 through 113 of process 100 (FIG. 1A). FIG. 1G could depict a top view of the nanosheet either FET 420a or FET 420b after operation 413.

A fourth alternative exemplary embodiment of a process to form electrical connections between the individual channel layers and the S/D connections of a nanosheet FET provides that the low-k dielectric material that is refilled in the undercut regions of the sacrificial layers is removed inwardly with respect to the end surfaces of the low-k dielectric material. The electrical connection to each nanosheet that is formed wraps around the end of the nanosheet to include a portion of a top surface and a bottom surface of the nanosheet to further reduce the parasitic resistance $R_{PARA}$. Additionally, the fourth alternative exemplary embodiment provides an alternative process for forming S/D connections to individual channel layers of nanosheet FETs of first and second conductivity types, thereby making the fourth alternative exemplary embodiment suitable for forming nanosheet FETs in CMOS circuits.

Figure 5A:
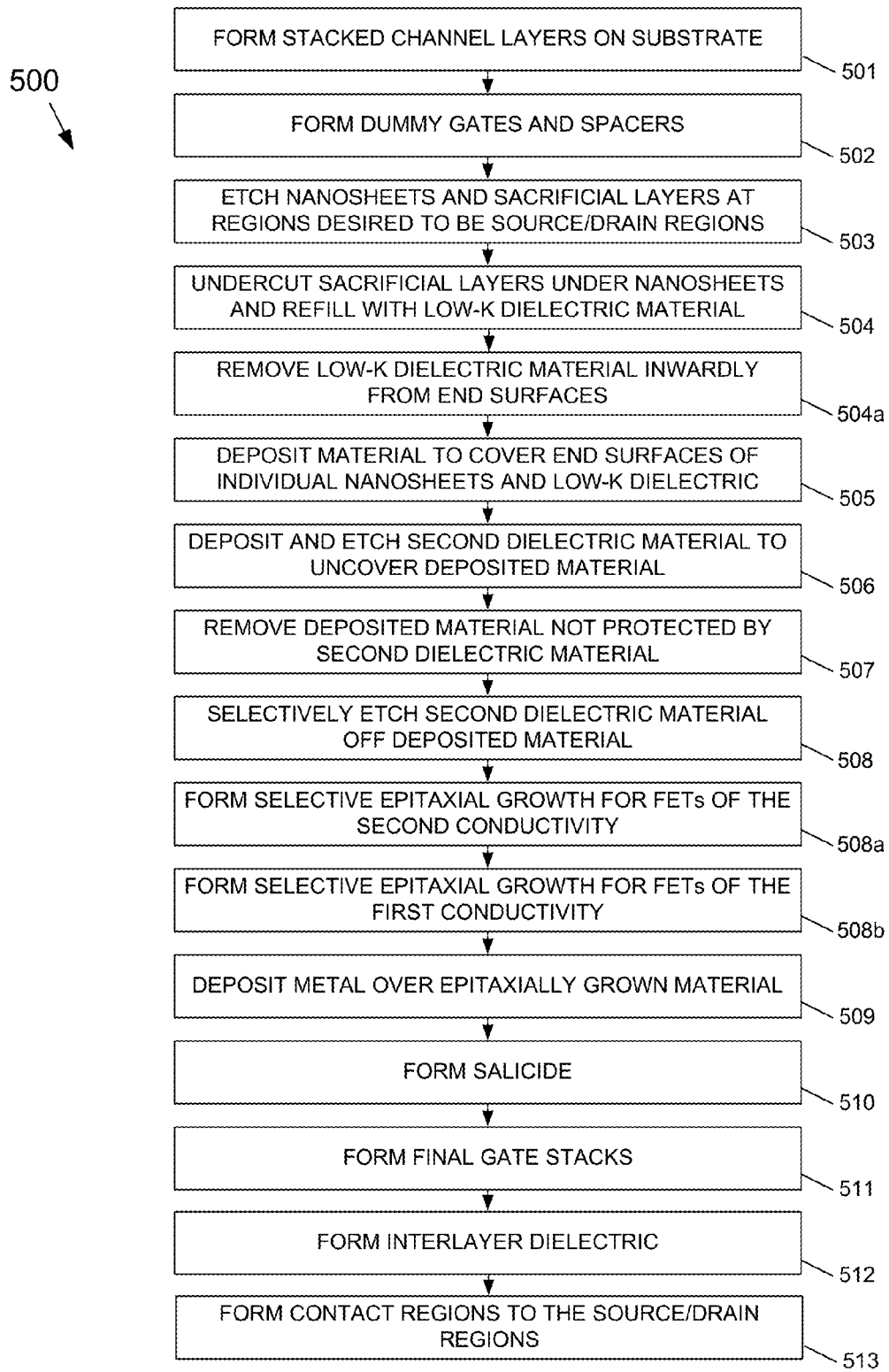
FIG. 5A depicts a flow diagram of a fourth alternative exemplary embodiment of a process to form electrical connections between the individual channel layers and the S/D connections of a nanosheet FET according to the subject matter disclosed herein.

FIG. 5A depicts a flow diagram of a fourth alternative exemplary embodiment of a process 500 to form electrical connections between the individual channel layers and the source/drain (S/D) connections of a nanosheet FET according to the subject matter disclosed herein.

Operations 501 through 504a of process 500 are similar to operations 201 through 204a of process 200 (FIG. 2A).

At 505, a material 228 is deposited in a well-known manner to cover the ends surfaces of the individual nanosheets 222 and etched-back the low-k dielectric material regions 227. In one exemplary embodiment, the material 228 may comprise a polycrystalline or an amorphous conductive material, a semiconductor material, or a combination thereof. In another exemplary embodiment, material 128 may comprise in part or in whole of Si, SiGe, Ge, III-V, or the like. In contrast to operation 105 of process 100, in one exemplary embodiment, after material 228 has been deposited at 405, material 228 is not in-situ doped. That is, the deposited material 228 is left undoped.

Operations 506 through 508 are similar to operations 206 through 208 of process 200 (FIG. 2A).

Figure 5C:
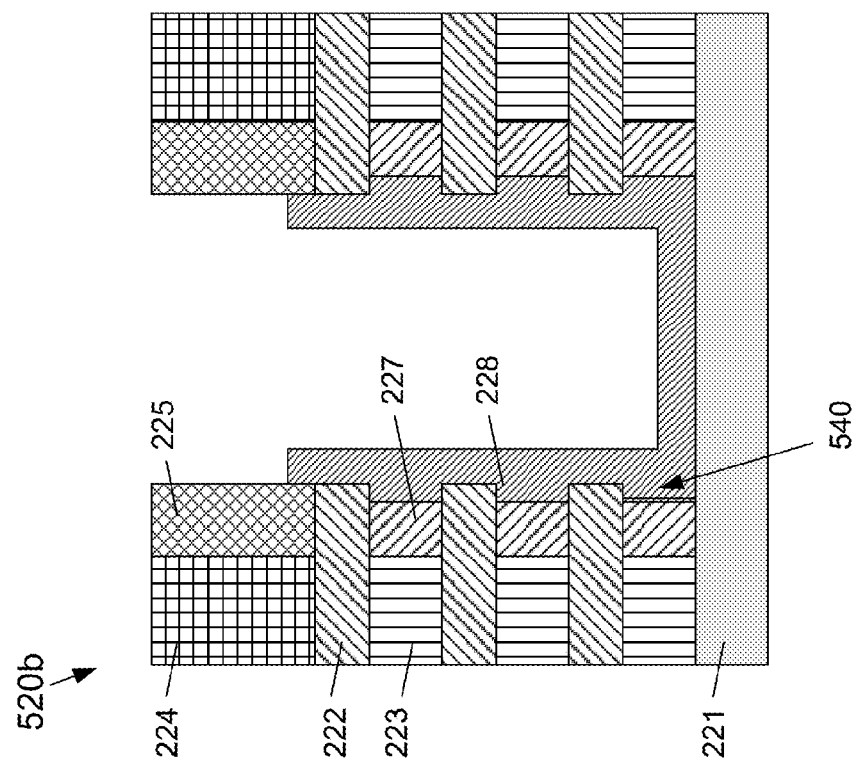
FIG. 5C depicts a cross-sectional view of a FET of a second conductivity type corresponding to line A-A' in FIG. 2A after the selectively epitaxially growing an overlay material.
Figure 5B:
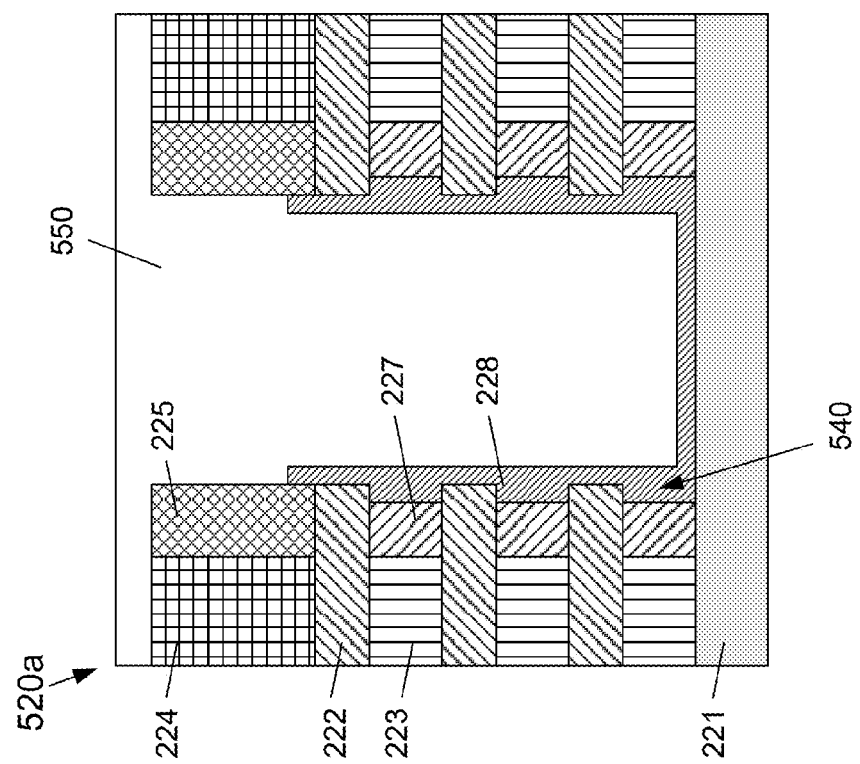
FIG. 5B depicts a cross-sectional view of a FET of a first conductivity type corresponding to line A-A' in FIG. 2A after a first masking layer has been formed.

At operation 508a, a first masking layer 550 is form over FETs 520a of a first conductivity type. FIG. 5B depicts a cross-sectional view of a FET 520a of the first conductivity type corresponding to line A-A' in FIG. 2A after the first masking layer 550 has been formed. The deposited material 228 formed in FETs 520b of the second conductivity type is used as a seed for selective epitaxial growth that can be in-situ doped or doped using a well-known plasma or implantation technique, if desired. FIG. 5C depicts a cross-sectional view of a FET 520b of the second conductivity type corresponding to line A-A' in FIG. 2A after the selectively epitaxially growing an overlay material. The inwardly etched regions 540 of the low-k dielectric material 227 provide electrical contacts to each nanosheet 222 that wrap around the end surface of each nanosheet and that includes a portion of a top surface and a bottom surface of the nanosheet 222.

At operation 508b, the first masking layer 550 is removed using well-known techniques, and a second masking layer (not shown) is formed on FETs 520a of the second conductivity type. The deposited material 228 formed in FETs 520a of the first conductivity type is used as a seed for selective epitaxial growth that can be doped using a well-known plasma or implantation technique, if desired. The second masking layer is then removed using a well-known technique. It should be understood that the order of operations 508a and 508b could be reversed.

Operations 509 through 513 are similar to operations 109 through 113 of process 100 (FIG. 1A). FIG. 1G could depict a top view of the nanosheet either FET 520a or FET 520b after operation 513.

Figure 6:
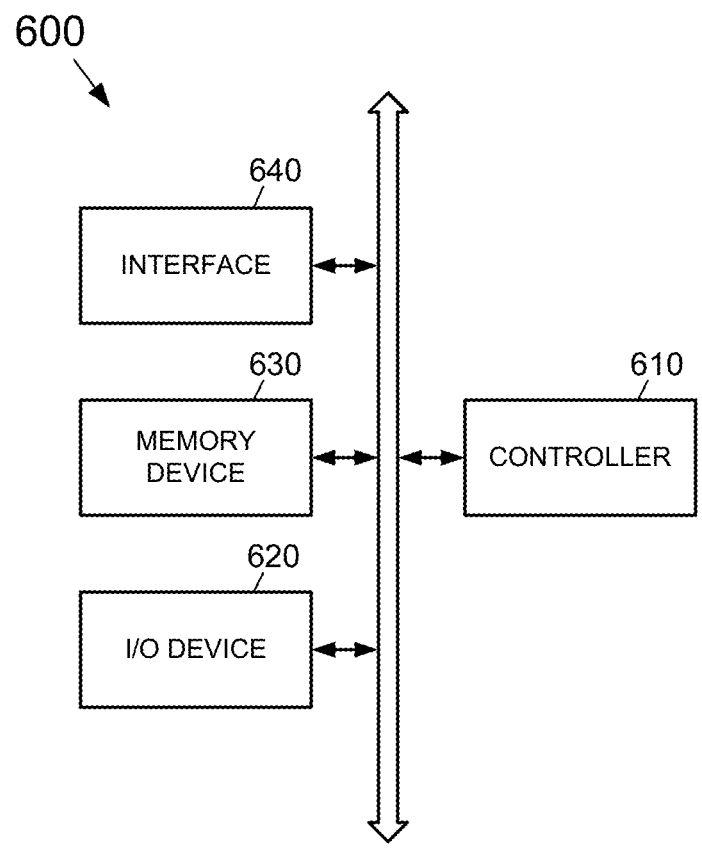
FIG. 6 depicts an electronic device that comprises one or more integrated circuits (chips) comprising one or more S/D connections to individual channel layers of a nanosheet FET according to exemplary embodiments disclosed herein.

FIG. 6 depicts an electronic device 600 that comprises one or more integrated circuits (chips) comprising one or more source/drain (S/D) connections to individual channel layers of a nanosheet FET according to exemplary embodiments disclosed herein. Electronic device 600 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 600 may comprise a controller 610, an input/output device 620 such as, but not limited to, a keypad, a keyboard, a display, or a touch-screen display, a memory 630, and a wireless interface 940 that are coupled to each other through a bus 650. The controller 610 may comprise, for example, at least one microprocessor, at least one digital signal process, at least one microcontroller, or the like. The memory 630 may be configured to store a command code to be used by the controller 610 or a user data. Electronic device 600 and the various system components comprising electronic device 600 may comprise one or more integrated circuits (chips) comprising high-performance FETs formed in critical-speed paths in which the high-performance FETs have a contacted poly pitch (CPP) within the same block of the chip that is greater than the CPP of FETs in noncritical-speed paths according to exemplary embodiments disclosed herein. The electronic device 600 may use a wireless interface 640 configured to transmit data to or receive data from a wireless communication network using a RF signal. The wireless interface 640 may include, for example, an antenna, a wireless transceiver and so on. The electronic system 600 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service—Time Division Duplex (UMTS-TDD), High Speed Packet Access (HSPA), Evolution Data Optimized (EVDO), Long Term Evolution—Advanced (LTE-Advanced), Multichannel Multipoint Distribution Service (MMDS), and so forth.

Figure 7:
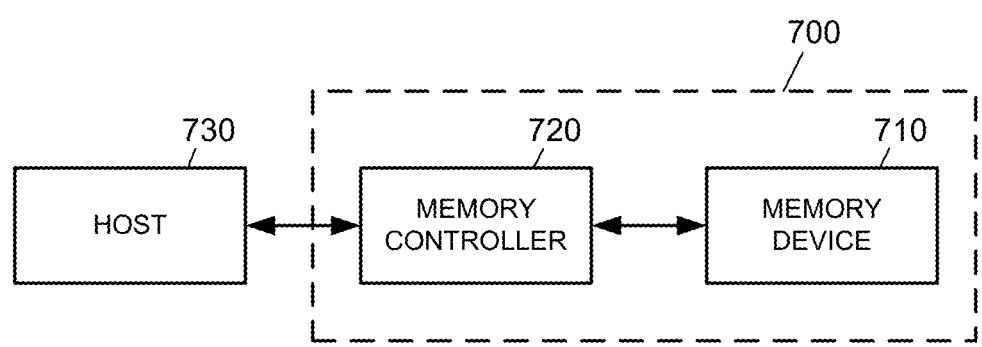
FIG. 7 depicts a memory system that may comprise one or more integrated circuits (chips) comprising S/D connections to individual channel layers of a nanosheet FET according to example embodiments disclosed herein.

FIG. 7 depicts a memory system 700 that may comprise one or more integrated circuits (chips) comprising source/drain (S/D) connections to individual channel layers of a nanosheet FET according to example embodiments disclosed herein. The memory system 700 may comprise a memory device 710 for storing large amounts of data and a memory controller 720. The memory controller 720 controls the memory device 710 to read data stored in the memory device 710 or to write data into the memory device 710 in response to a read/write request of a host 730. The memory controller 730 may include an address-mapping table for mapping an address provided from the host 730 (e.g., a mobile device or a computer system) into a physical address of the memory device 710. The memory device 710 may comprise one or more semiconductor devices according to exemplary embodiments disclosed herein.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the appended claims.

What is claimed is:

1. A method to form a semiconductor device, the method comprising:

forming a nanosheet layer/sacrificial layer stack comprising at least one nanosheet layer/sacrificial layer pair, each nanosheet layer/sacrificial layer pair comprising a top surface, a bottom surface, a first end surface and a second end surface, the top surface of the pair being opposite the bottom surface and the first end surface of the pair being opposite the second end surface, the nanosheet layer being on one side of the pair and the sacrificial layer being on an opposing side of the pair, the nanosheet layer comprising a first thickness at the first end surface of the pair, the sacrificial layer comprising a second thickness at the first end surface of the pair, and the first thickness and the second thicknesses both being measured in a direction that is between the top surface and the bottom surface of the pair;

removing a predetermined amount of the sacrificial layer from the first end surface of the sacrificial layer of at least one pair to form a first space associated with the pair;

forming a low-k dielectric material in each first space so that a surface of the low-k dielectric material proximate to the first end surface of the pair is in substantial alignment with the first end surface of the nanosheet layer;

forming a first conductive material layer comprising a first surface and a second surface, the first surface of the first conductive material layer being formed on the first end surface of the each pair of the stack, and the second surface of the first conductive material layer being opposite the first surface of the first conductive material layer; and forming a source/drain contact on the second surface of the first conductive material layer.

2. The method according to claim 1, further comprising before forming the source/drain contact on the second surface of the first conductive material layer, forming a second conductive material layer comprising a first surface and a second surface, the first surface of the second conductive material layer being formed on the second surface of the first conductive material layer, and wherein forming the source/drain contact on the second surface of the first conductive material layer comprises forming the source/drain contact on the second surface of the second conductive material layer.

3. The method according to claim 2, further comprising reacting the second conductive material layer with the first conductive material layer to form a salicide.

4. The method according to claim 1, wherein the first conductive material layer is formed by deposition.

5. The method according to claim 1, wherein the first conductive material layer comprises a polycrystalline or an amorphous conductive material, a semiconductor material, a metallic material, or a combination thereof.

6. The method according to claim 1, wherein the first conductive material layer comprises at least in part Ti, Co, Ni, Pt, Ta, Mo, W, a metallic nitrided alloy, or a metallic nitrided silicide.

7. The method according to claim 1, wherein forming the low-k dielectric material in each first space comprises forming the low-k dielectric material so that a surface of the low-k dielectric material proximate to the first end surface of the pair is recessed toward the second end surface of the pair from the first end surface of the nanosheet layer of the pair.

8. The method according to claim 1, wherein the semiconductor device comprises a nanosheet field effect transistor (FET) of a first conductivity type or nanosheet FET of a second conductivity type, the first conductivity type being opposite from the second conductivity type.

9. A field effect transistor (FET), comprising:

a channel region comprising a nanosheet layer/sacrificial layer stack, the nanosheet layer/sacrificial layer stack comprising at least one nanosheet layer/sacrificial layer pair, each nanosheet layer/sacrificial layer pair comprising a top surface, a bottom surface, a first end surface and a second end surface, the top surface of the pair being opposite the bottom surface and the first end surface of the pair being opposite the second end surface, the nanosheet layer being on one side of the pair and the sacrificial layer being on an opposing side of the pair, the nanosheet layer comprising a first thickness at the first end surface of the pair, the sacrificial layer comprising a second thickness at the first end surface of the pair, the first thickness and the second thicknesses both being measured in a direction that is between the top surface and the bottom surface of the pair, a portion of the sacrificial layer of at least one nanosheet layer/sacrificial layer pair further comprising a low-k dielectric material proximate to the first end surface of the pair, and a surface of the low-k dielectric material proximate to the first end surface of the pair being recessed toward the second end surface of the pair from the first end surface of the nanosheet layer;

a conductive material layer comprising a first surface and a second surface, the first surface of the conductive material layer being formed on the first end surface of each pair of the stack, and the second surface of the conductive material layer being opposite the first surface of the conductive material layer; and a source/drain contact formed on the second surface of the conductive material layer.

10. The FET according to claim 9, wherein the conductive material layer comprises at least in part a salicide.

11. The FET according to claim 9, wherein the conductive layer comprises a polycrystalline or an amorphous conductive material, a semiconductor material, a metallic material, or a combination thereof.

12. The FET according to claim 9, wherein the conductive layer comprises at least in part Ti, Co, Ni, Pt, Ta, Mo, W, a metallic nitrided alloy, or a metallic nitrided silicide.

13. The FET according to claim 9, wherein a surface of the low-k dielectric material proximate to the first end surface of the pair is in substantial alignment with the first end surface of the nanosheet layer.

14. A field effect transistor (FET), comprising:

a first source/drain (S/D) region;

a second S/D region; and a channel region disposed between the first S/D region and the second S/D region, the channel region comprising:

a plurality of nanosheet layer/sacrificial layer pairs formed on each other, each nanosheet layer/sacrificial layer pair comprising:

a top surface, a bottom surface, a first end surface and a second end surface, the top surface being opposite the bottom surface and the first end surface being opposite the second end surface, the nanosheet layer being on one side of the pair and the sacrificial layer being on an opposing side of the pair, the nanosheet layer comprising a first thickness at the first end surface of the pair and a second thickness at the second end surface of the pair, the sacrificial layer comprising a third thickness at the first end surface of the pair and a fourth thickness at the second end surface of the pair, the first, second, third and fourth thicknesses being measured in a direction that is between the top surface and the bottom surface of the pair, a portion of the sacrificial layer of at least one nanosheet layer/sacrificial layer pair further comprising a low-k dielectric material proximate to the first end surface of the pair, and a surface of the low-k dielectric material proximate to the first end of the pair being recessed toward the second end surface of the pair from the first end surface of the nanosheet layer, and a first conductive material layer comprising a first surface and a second surface, the first surface of the first conductive material layer being formed on the first end surface of each of the plurality of pairs, and the second surface of the first conductive material layer being opposite the first surface of the first conductive material layer and being coupled to the first source/drain region.

15. The FET according to claim 14,
wherein a surface of the low-k dielectric material proximate to the first end of the pair is in substantial alignment with the first end surface of the nanosheet layer.

16. The FET according to claim 14, wherein the channel region further comprises a second conductive material layer comprising a first surface and a second surface, the first surface of the second conductive material layer being formed on the second end surface of each of the plurality of pairs, and the second surface of the second conductive material layer being opposite the first surface of the second conductive material layer and being coupled to the second source/drain region.

* * * * *